(12) United States Patent  
Fukuhara et al.

(10) Patent No.: US 8,299,841 B2
(45) Date of Patent: Oct. 30, 2012

(54) SEMICONDUCTOR DEVICE

(75) Inventors: Jun Fukuhara, Kanagawa (JP);
Tsuyoshi Mitsuda, Kanagawa (JP)

(73) Assignee: Renesas Electronics Corporation,
Kanagawa (JP)

( * ) Notice: Subject to any disclaimer, the term of this patent is extended or adjusted under 35 U.S.C. 154(b) by 163 days.

(21) Appl. No.: 12/902,822

(22) Filed: Oct. 12, 2010

(65) Prior Publication Data

US 2011/0095738 A1  Apr. 28, 2011

(30) Foreign Application Priority Data

Oct. 23, 2009 (JP) ................................ 2009-244622

(51) Int. Cl.
*H03K 17/687* (2006.01)
(52) U.S. Cl. .......................... 327/427; 327/380; 327/381
(58) Field of Classification Search .................. 327/380, 327/381, 427
See application file for complete search history.

(56) References Cited

U.S. PATENT DOCUMENTS

| | | | | |
|---|---|---|---|---|
| 4,529,947 A | * | 7/1985 | Biard et al. | 330/259 |
| 4,688,001 A | * | 8/1987 | Dijkmans et al. | 330/273 |
| 4,700,087 A | * | 10/1987 | Stroberger | 326/75 |
| 4,912,344 A | * | 3/1990 | Yin | 326/89 |
| 5,166,636 A | * | 11/1992 | Bien | 330/255 |
| 5,220,209 A | * | 6/1993 | Seymour | 326/27 |
| 5,424,892 A | | 6/1995 | Topp et al. | |
| 6,144,245 A | * | 11/2000 | Balogh | 327/380 |
| 6,351,158 B1 | * | 2/2002 | Shearon et al. | 327/108 |
| 6,370,046 B1 | * | 4/2002 | Nebrigic et al. | 363/60 |
| 6,911,848 B2 | * | 6/2005 | Vinciarelli | 327/108 |
| 7,109,690 B2 | * | 9/2006 | Ke et al. | 323/273 |
| 7,282,948 B2 | * | 10/2007 | Bales | 326/30 |
| 7,397,227 B2 | * | 7/2008 | Ke et al. | 323/273 |
| 7,741,984 B2 | | 6/2010 | Lee et al. | |
| 2005/0073286 A1 | * | 4/2005 | Ke et al. | 323/280 |
| 2005/0134315 A1 | | 6/2005 | Nakahara et al. | |
| 2006/0214651 A1 | * | 9/2006 | Ke et al. | 323/311 |
| 2011/0095738 A1 | * | 4/2011 | Fukuhara et al. | 323/282 |
| 2011/0163794 A1 | * | 7/2011 | Soma et al. | 327/534 |
| 2011/0163800 A1 | * | 7/2011 | Soma et al. | 327/543 |

FOREIGN PATENT DOCUMENTS

JP  2005123666 A  5/2005

* cited by examiner

*Primary Examiner* — Lincoln Donovan
*Assistant Examiner* — Adam Houston
(74) *Attorney, Agent, or Firm* — Foley & Lardner LLP

(57) ABSTRACT

A semiconductor device according to an exemplary embodiment of the present invention includes a discharge circuit and a control circuit. The discharge circuit includes a first transistor connected between a gate of an output transistor and an output terminal, and a capacitor connected to a gate of the first transistor, and discharges a gate voltage of the output transistor to the output terminal by turning on the first transistor with an electric charge of the capacitor. The control circuit includes a charge path, a first discharge path, and a second discharge path. The first discharge path discharges an electric charge of the charged capacitor when the system turns off. The second discharge path discharges the electric charge of the capacitor for a time period longer than a time period for discharging the output transistor by the discharge circuit upon detection of an abnormality in the system.

17 Claims, 14 Drawing Sheets

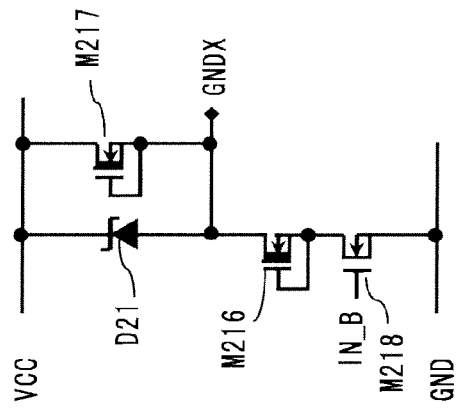

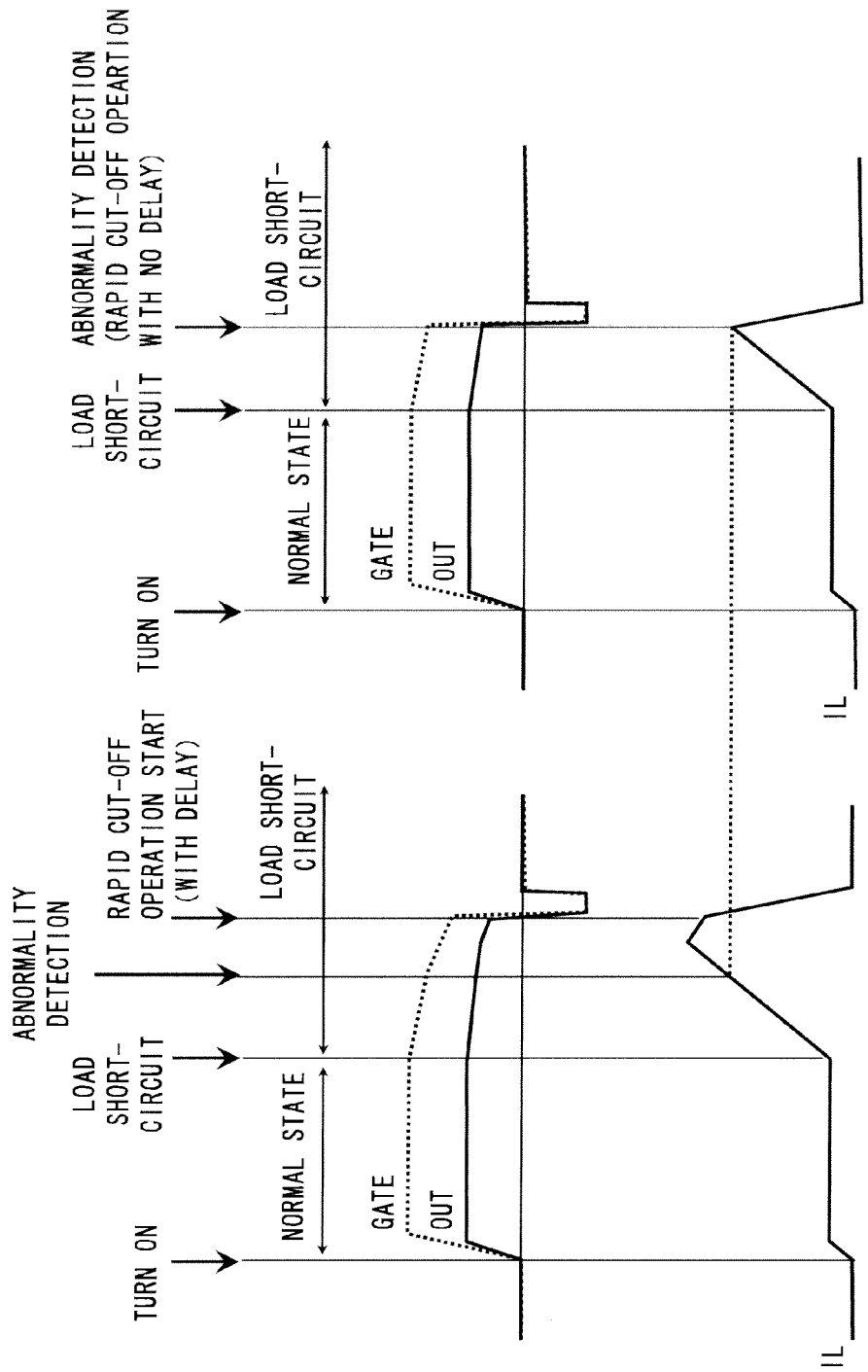

SEMICONDUCTOR DEVICE

INCORPORATION BY REFERENCE

This application is based upon and claims the benefit of priority from Japanese patent application No. 2009-244622, filed on Oct. 23, 2009, the disclosure of which is incorporated herein in its entirety by reference.

BACKGROUND

1. Field of the Invention

The present invention relates to a semiconductor device and a control method thereof, and more particularly, to a semiconductor device having a function of rapidly turning off, upon detection of an abnormality, an output transistor that supplies a current to a load, and a control method thereof.

2. Description of Related Art

In recent years, semiconductor devices have been used in systems having a switch function capable of driving a large current, as typified by electrical components for automobiles. Each system that drives a large current has a function of switching itself off upon detection of an overheat, an overcurrent, or the like so as to protect the system when an abnormality occurs in which a load is short-circuited and a large current flows, for example.

In the operation in which the system switches itself off upon detection of an abnormality, it is important to reduce a heat loss that occurs upon turn-off. This is because if a large heat loss occurs upon turn-off, a breakdown may occur, since it is highly possible that a large amount of heat is generated when an abnormality is detected. Accordingly, in the turn-off operation upon detection of an abnormality, it is important to rapidly turn off.

FIG. 12A is a block diagram showing a high-side output IC 30 which is provided with a GND terminal. Since the high-side output IC 30 is provided with the GND terminal, an electric charge stored in the control terminal of the output transistor can be discharged not only to an output terminal OUT but also to the GND terminal to turn off the high-side output transistor. The turn-off operation is achieved by discharging the electric charge to the output terminal OUT or to both the output terminal OUT and the GND terminal. Meanwhile, when the GND terminal is not provided, an IN terminal of the circuit serves as the GND terminal. Upon receiving an input OFF signal, the IN terminal becomes "H" level. Generally, the high-side output transistor is turned off by discharging the electric charge from the gate only to the output terminal OUT.

FIG. 13 is a diagram showing an output circuit 200 of prior art (Japanese Unexamined Patent Application Publication No. 2005-123666 (kojima)). Transistors Q1 and Q2 are N-type depletion or enhancement transistors, and a transistor Q3 is an N-type enhancement transistor. A power supply terminal VCC and an output terminal OUT are connected through an output transistor 100. Signals for controlling the transistors Q1, Q2, and Q3 are output from a state determination circuit. The output circuit 200 performs a turn-off operation as described below. The output circuit 200 activates one or more of discharge paths. The discharge paths are formed of Q1 and R1, Q2 and R2, and Q3, respectively. The gate charge of the output transistor is discharged to the output terminal OUT, thereby turning off the output transistor.

During a normal turn-off operation, the transistor Q1 is activated. During a rapid turn-off operation in an overcurrent state, only the transistor Q3 is activated, or the transistors Q1, Q2, and Q3 are simultaneously activated. During the turn-off operation in which the current is larger than that in the normal state and smaller than the overcurrent, only the transistor Q2 is activated, or both the transistor Q1 and Q2 are activated at the same time. The slew rate is adjusted by changing the paths to be activated according to the current value.

In the overcurrent state, the operation of the transistor Q3, which is an enhancement transistor, is especially important. The rapid turn-off operation is accomplished in such a manner that the transistor Q3 rapidly discharges the gate charge of the output transistor. Assume herein that a potential of the output terminal OUT is OUT; a potential of the power supply terminal VCC is VCC; an on-resistance of the transistor Q3 is Ron; a current flowing through the output transistor 100 is IL; and a gate-source voltage of the transistor Q3 is Vgs.

SUMMARY

However, in order to use the output circuit 200 shown in FIG. 13 as the high-side output IC, it is necessary to take some measures as described below. The transistor Q3, which is an N-type enhancement transistor, needs to operate in a linear region so as to discharge the gate charge to the source with a small resistance value. For this reason, the gate needs to be applied with a voltage higher than OUT which is equal to the source voltage. Assuming that OUT=VCC−Ron×IL, where VCC=12V, Ron=10 mΩ, and IL=100 A, for example, OUT=12 V−10 mΩ×100 A=11 V. Even when VCC, which is a maximum potential that can be used in a typical system, is applied, Vgs=VCC−OUT=1 V is obtained, and thus the transistor Q3 does not operate in the linear region having a sufficiently small resistance value. This causes a problem that it takes time for the transistor Q3 to start a rapid discharge operation upon detection of an abnormality. Therefore, it is necessary to apply a voltage of VCC or higher to the gate of the transistor Q3 using a bootstrap circuit so as to drive the gate of the transistor Q3.

FIG. 14A is a diagram showing an exemplary configuration of a bootstrap circuit 101. The bootstrap circuit 101 applies a voltage of VCC or higher to a gate of a transistor M211 which is connected between a gate of an output transistor M210 and an output terminal OUT. The bootstrap circuit 101 includes the output transistor M210, the transistor M211, and a capacitor C210. The output transistor M210 is connected between a power supply terminal VCC and the output terminal OUT. The transistor M211 is an enhancement-type transistor connected between the gate of the output transistor M210 and the output terminal OUT. The gate of the transistor M211 is connected to the capacitor C210. The bootstrap circuit 101 turns on the transistor M211 and turns off the output transistor M210 based on a BOOT signal supplied from the outside. In the manner as described above, the rapid discharge operation of the output transistor M210 is carried out. Hereinafter, the BOOT signal is described in cases where the GND terminal is provided and the GND terminal is not provided.

(1)
(i) When the GND terminal is provided and "L" level is set to GND
Normal ON state BOOT=GND
Normal OFF state BOOT=GND
Abnormality detection OFF state BOOT=VCC
In this case, "L" level is set to GND, so the "L" level fluctuates depending on the power supply voltage. The bootstrap operation is affected by the voltage level of BOOT, and thus a power supply voltage dependence is generated. Additionally, the elements provided within the circuit, to which the power supply voltage is directly applied, need to be composed of high-voltage elements. This causes a problem of increase in circuit area. This problem can be solved by using an internal power supply as described in the following item (ii).

(ii) When the GND terminal is provided and "L" level is set to an internal power supply (GNDX) with VCC as a reference
Normal ON state BOOT=GNDX
Normal OFF state BOOT=GNDX=VCC
Abnormality detection OFF state BOOT=VCC In this case, also the power supply circuit does not operate in the OFF state. Accordingly, the "L" level of the BOOT signal becomes VCC in the normal state, and the BOOT signal in the normal OFF state is the same as that in the abnormality detection state.

(2) When the GND terminal is not provided and the IN terminal serves as the GND terminal
Normal ON state BOOT=GNDX (IN)
Normal OFF state BOOT=GNDX (IN)=VCC
Abnormality detection OFF state BOOT=VCC When the IN terminal serves as the GND terminal, even if the "L" level is set to GNDX or IN (GND), the BOOT signal in the normal OFF state is the same as that in the abnormality detection state as in the case of (1)(ii), and a rapid cut-off operation is carried out also in the normal OFF state. When the rapid cut-off operation is carried out in the normal OFF state, the slew rate becomes too high. This results in a problem of occurrence of noise. In view of the above, it is necessary to take some measures to avoid the rapid cut-off operation during the normal OFF state.

A bootstrap circuit 102 is a modified version of the bootstrap circuit 101 so as to avoid the rapid cut-off operation during the normal OFF state. FIG. 14B is a circuit diagram of the bootstrap circuit 102. The bootstrap circuit 102 includes the output transistor M210, transistors M211 to M213, and the capacitor C210. The transistors M210 and M211 are similar to those shown in FIG. 14A.

The transistor M213 is an enhancement-type transistor connected between the source of the transistor M211 and the output terminal OUT. The backgate and source of the transistor M213 are short-circuited. The gate of the transistor M213 is connected to the source of the transistor M212.

The transistor M212 and the output transistor M210 each have a drain connected to the power supply terminal VCC, and the gates thereof are connected together. The transistor M212 is a sense transistor using the output transistor M210 as a main transistor. Here, the sense transistor is described. The sense transistor allows a current of 1/sense ratio of the main transistor to flow when the same source voltage is applied. For instance, when a current of 10 A flows through the main transistor with a sense ratio of 1/1000, a current of 10 mA flows through the sense transistor. Referring to FIG. 14B, the transistor M213 is connected in series with the transistor M211 for rapid cut-off operation so as to allow the transistor M213 to turn off in the normal OFF state and to turn on upon detection of an abnormality. This makes it possible to switch operations between the normal OFF state and the abnormality detection state even when the transistor M211 can turn on in both the normal OFF state and the rapid OFF state.

Specific operations are described below. During the normal OFF state in which a normal load current flows through the main transistor, the value of the current flowing through the sense transistor is small. Accordingly, a voltage of a sense terminal is low, and the transistor M213 does not turn on. Meanwhile, during the abnormality detection OFF state, a large current flows through the main transistor, and a large current also flows through the sense transistor, with the result that the transistor M213 turns on. Thus, the normal OFF state and the abnormality detection OFF state can be distinguished from each other.

However, after an extensive study, the inventors have found that a loss may occur under certain conditions, as described below. In the bootstrap circuit 102, the transistor M213 does not operate with a sufficiently low on-resistance (linear region) unless the voltage SENSE of the source of the transistor M212 becomes higher than OUT (SENSE>OUT) and the voltage OUT decreases to some extent. In particular, if an abnormality is detected in the state where the level of OUT is relatively high, the transistor M213 is difficult to turn on. For this reason, it is necessary to decrease the voltage OUT using elements for normal turn-off operation during a period from the time when the abnormality detection is activated to the time when the voltage OUT decreases. FIGS. 15A and 15B are graphs each showing a current IL flowing through the output transistor M210, a gate voltage GATE of the output transistor, and the voltage OUT of the output terminal OUT. Upon detection of an abnormality when the load, which has been in the normal state (OUT≈VCC), is short-circuited (OUT=Ron×IL<VCC), the current flowing through the load continuously increases as shown in FIGS. 15A and 15B, and it takes time to start the rapid discharge operation after detection of an abnormality. As a result, a peak current during the turn-off operation increases, which results in a loss of the system.

A first exemplary aspect of the present invention is a semiconductor device which is connected between a power supply terminal and an output terminal and turns off an output transistor that outputs a current to a load connected to the output terminal, upon detection of an abnormality in a system. The semiconductor device includes a discharge circuit and a control circuit. The discharge circuit includes: a first transistor connected between a gate of the output transistor and the output terminal; and a capacitor connected between a gate of the first transistor and an external abnormality detection circuit, and discharges a gate voltage of the output transistor to the output terminal by turning on the first transistor with an electric charge of the capacitor, based on an abnormality detection signal from the abnormality detection circuit. The control circuit includes: a charge path for charging the capacitor when a system turns on; a first discharge path for discharging an electric charge of the charged capacitor when the system turns off; and a second discharge path for discharging the electric charge of the capacitor for a time period longer than a time period for discharging the gate voltage of the output transistor by the discharge circuit, upon detection of an abnormality in the system.

A second exemplary aspect of the present invention is a control method of a semiconductor device that turns off an output transistor upon detection of an abnormality in a system, the output transistor being connected between a power supply terminal and an output terminal and outputting a current to a load connected to the output terminal, the control method including: charging a capacitor when the system turns on, the capacitor having one end connected to an external abnormality detection circuit, and the other end connected between a gate of the output transistor and the output terminal; discharging a gate voltage of the output transistor to the output terminal by turning on the first transistor with an electric charge of the capacitor, based on an abnormality detection signal from the abnormality detection circuit; and discharging the electric charge of the capacitor to the output terminal for a time period longer than a time period for discharging the gate voltage of the output transistor.

According to exemplary aspects of the present invention, the gate voltage of the output transistor is discharged to the output terminal by turning on the first transistor with the electric charge of the capacitor, based on the abnormality detection signal from the abnormality detection circuit. Further, the electric charge of the capacitor is discharged to the output terminal for a time period longer than a time period for discharging the gate voltage of the output transistor. Consequently, the rapid discharge operation can be performed immediately after detection of an abnormality.

According to exemplary aspects of the present invention, it is possible to provide a semiconductor device which rapidly turns off an output transistor that supplies a current to a load, upon detection of an abnormality, and a control method thereof.

BRIEF DESCRIPTION OF THE DRAWINGS

The above and other exemplary aspects, advantages and features will be more apparent from the following description of certain exemplary embodiments taken in conjunction with the accompanying drawings, in which:

FIGS. 2A and 2B are circuit diagrams each showing an internal power supply 2 according to the first exemplary embodiment;

FIGS. 15A and 15B are graphs each showing a current and a voltage of an exemplary bootstrap circuit.

DETAILED DESCRIPTION OF THE EXEMPLARY EMBODIMENTS

Figure 1A:
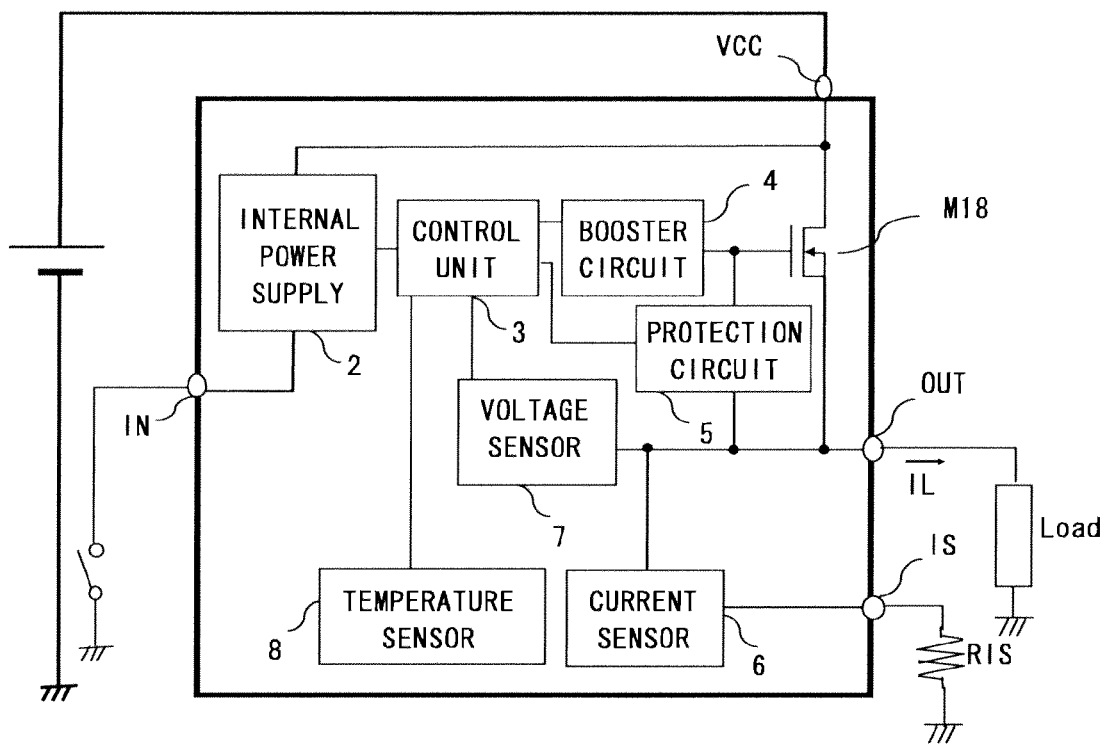
FIG. 1A is a block diagram showing a high-side output circuit according to a first exemplary embodiment of the present invention.

[First Exemplary Embodiment]
Exemplary embodiments of the present invention will be described below with reference to the accompanying drawings. FIG. 1A is a block diagram showing a high-side output circuit 1 according to a first exemplary embodiment of the present invention. The high-side output circuit 1 according to the first exemplary embodiment is connected between a power supply terminal VCC and an output terminal OUT, and includes an output transistor M18 which is connected to the output terminal OUT and outputs a current to a load. The high-side output circuit 1 also includes abnormality detection circuits and a protection circuit 5. The abnormality detection circuits detect an abnormality in a system. The protection circuit 5 rapidly turns off the output transistor M18 when the abnormality detection circuits detect an abnormality in the system. The protection circuit 5 includes a semiconductor device 9 according to the first exemplary embodiment. The semiconductor device 9 rapidly turns off upon detection of an abnormality.

The high-side output circuit 1 includes, as the abnormality detection circuits, a voltage sensor 7, a temperature sensor 8, and a current sensor 6. The high-side output circuit 1 further includes an internal power supply 2, a control unit 3, a booster circuit 4, an input terminal IN, and a discharge terminal IS of the current sensor 6.

Figure 1B:
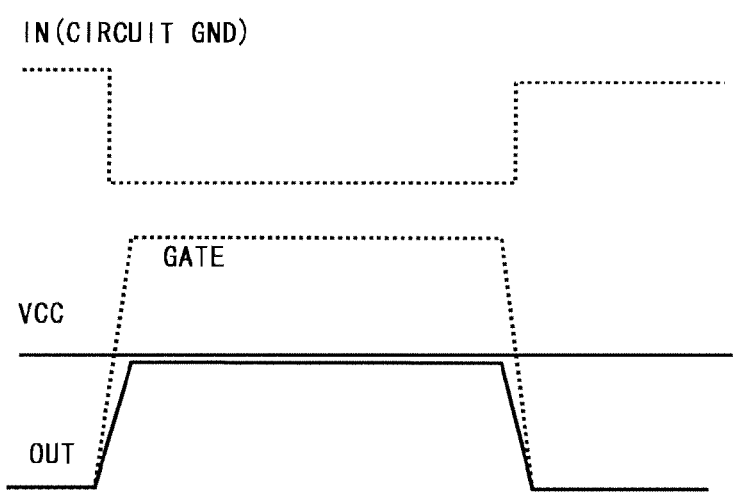
FIG. 1B is a timing diagram showing a variation in potential when the high-side output circuit turns on and off in a normal state.

FIG. 1B is a timing diagram showing a variation in potential when the high-side output circuit turns on and off in a normal state. Assume herein that a potential of the input terminal IN is IN; a gate potential of the output transistor M18 is GATE; a power supply voltage is VCC; and a potential of the output terminal OUT is OUT. When a switch S turns on and the input voltage IN becomes equal to the ground level, the booster circuit 4 generates a boosted voltage which is higher than the power supply voltage VCC, and supplies the boosted voltage to the gate of the output transistor M18. This allows the output transistor M18 to turn on, thereby allowing a current to flow through the load.

An operation during a time period after the detection of an abnormality until the rapid turn-off operation according to the first exemplary embodiment is described below. First, the current sensor 6, the temperature sensor 8, and the voltage sensor 7, which are abnormality detection circuits, detect an abnormality and output control signals OC, OT, and VON, respectively. Next, the control unit 3 receives the control signals and outputs an abnormality detection signal BOOT. The protection circuit 5 receives the abnormality detection signal BOOT and carries out a rapid discharge operation.

The internal power supply 2 is described below. FIG. 2A is a circuit diagram showing the internal power supply 2. The internal power supply 2 generates an internal power supply voltage GNDX based on the potential VCC of the power supply terminal VCC and a potential GND of a GND terminal. The internal power supply 2 supplies the internal power supply voltage GNDX to the control unit 3. The internal power supply 2 includes a Zener diode D21 and transistors M216 to M218. The transistors M216 and M217 are N-type depletion transistors. The gate and source of each of the transistors M216 and M217 are short-circuited. The transistor M218 is an N-type enhancement transistor. The gate of the transistor M218 receives an input inversion signal IN_B.

In the internal power supply 2, when the high-side output circuit 1 is active, the input inversion signal IN_B is equal to "VCC" (IN_B="VCC"). The input inversion signal IN_B turns on the transistor M218, so that the transistor M216 functioning as a constant current source allows a current to flow through the Zener diode D21 to thereby break down the Zener diode D21. Assuming that a breakdown voltage of the Zener diode D21 is VZe, GNDX=VCC−VZe is satisfied. In an OFF state, the inversion signal IN_B becomes "L" (IN_B="L") and the transistor M216 is cut off, resulting in GNDX="VCC".

An abnormality detection signal generation circuit 21 is described below. FIG. 2B shows the abnormality detection signal generation circuit 21. The abnormality detection signal generation circuit 21 can constitute a part of the control unit 3. Transistors M220 to M222 are P-type enhancement transistors, and transistors M223 to MM225 are N-type enhancement transistors. The transistors M220 to M225 are turned on upon receiving the control signals at the gates thereof. The abnormality detection signal generation circuit 21 operates between the internal power supply VCC and GNDX. The control detection signal OC is output by the current sensor 6 upon detection of an overcurrent. The control signal OT is output by the temperature sensor 8 upon detection of an overheat. The control signal VON is output by the voltage sensor 7 upon detection of an overvoltage Vds (drain-source voltage) of the output transistor M18. The control signals OC, OT, and VON are equal to VCC when the system is in the normal state, and are equal to GNDX when an abnormality is detected.

The abnormality detection signal BOOT becomes GNDX (BOOT="GNDX") in a normal ON state, and becomes VCC (BOOT="VCC") in a normal OFF state. The abnormality detection signal BOOT also becomes VCC (BOOT="VCC") when the abnormality detection circuits detect an abnormality and determine that an abnormality occurs when one or more of the abnormality detection signals OC, OT, and VON are active.

In the first exemplary embodiment, a description is given of the case where the high-side output circuit 1 has no GND terminal. In the semiconductor device of the related art having no GND terminal, there is a problem that a rapid cut-off operation is carried out in the normal OFF state even when the abnormality detection signal BOOT in the normal state is set to GNDX or IN. Therefore, the present invention is especially effective.

Figure 3:
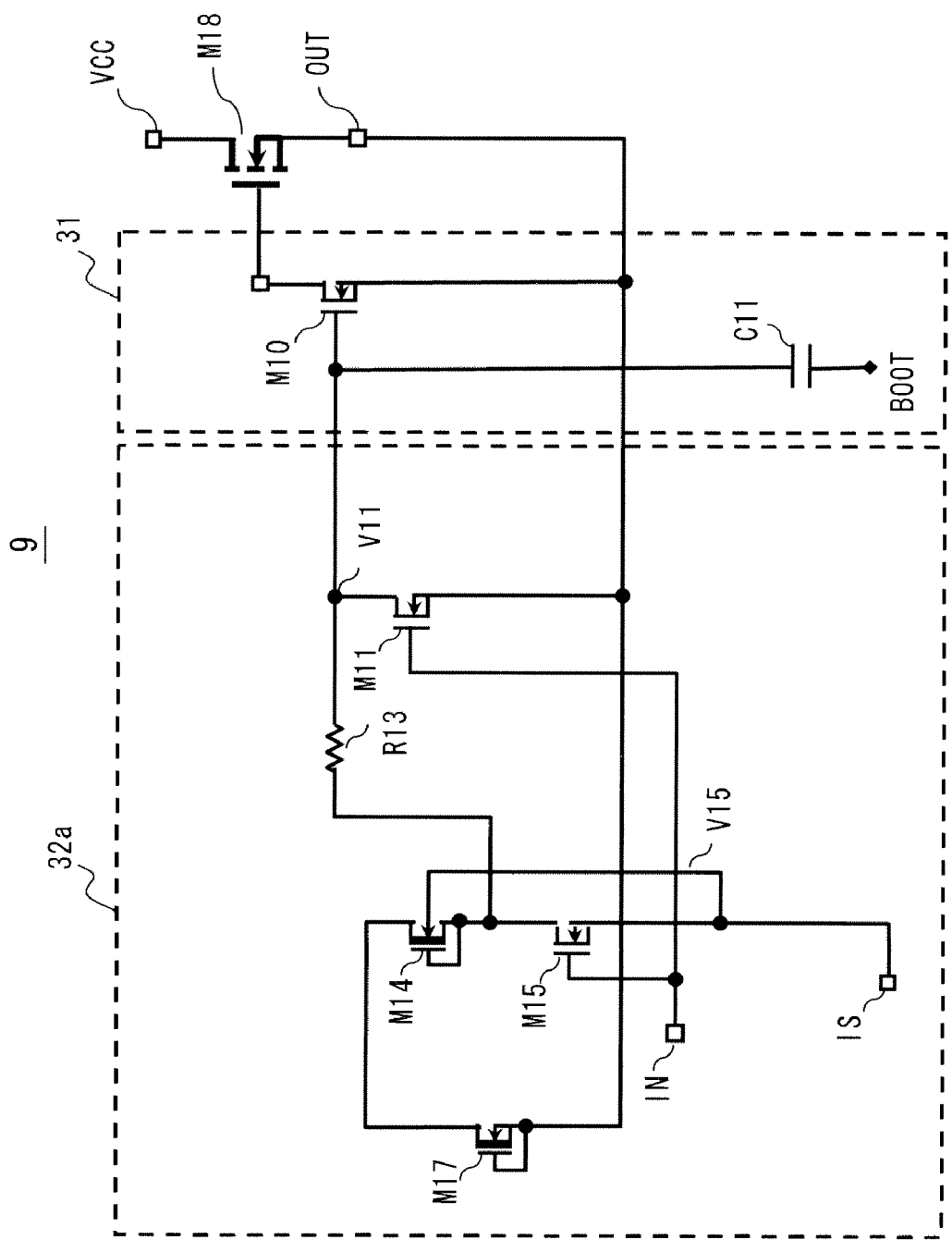
FIG. 3 is a circuit diagram showing a semiconductor device according to the first exemplary embodiment.
Figure 4:
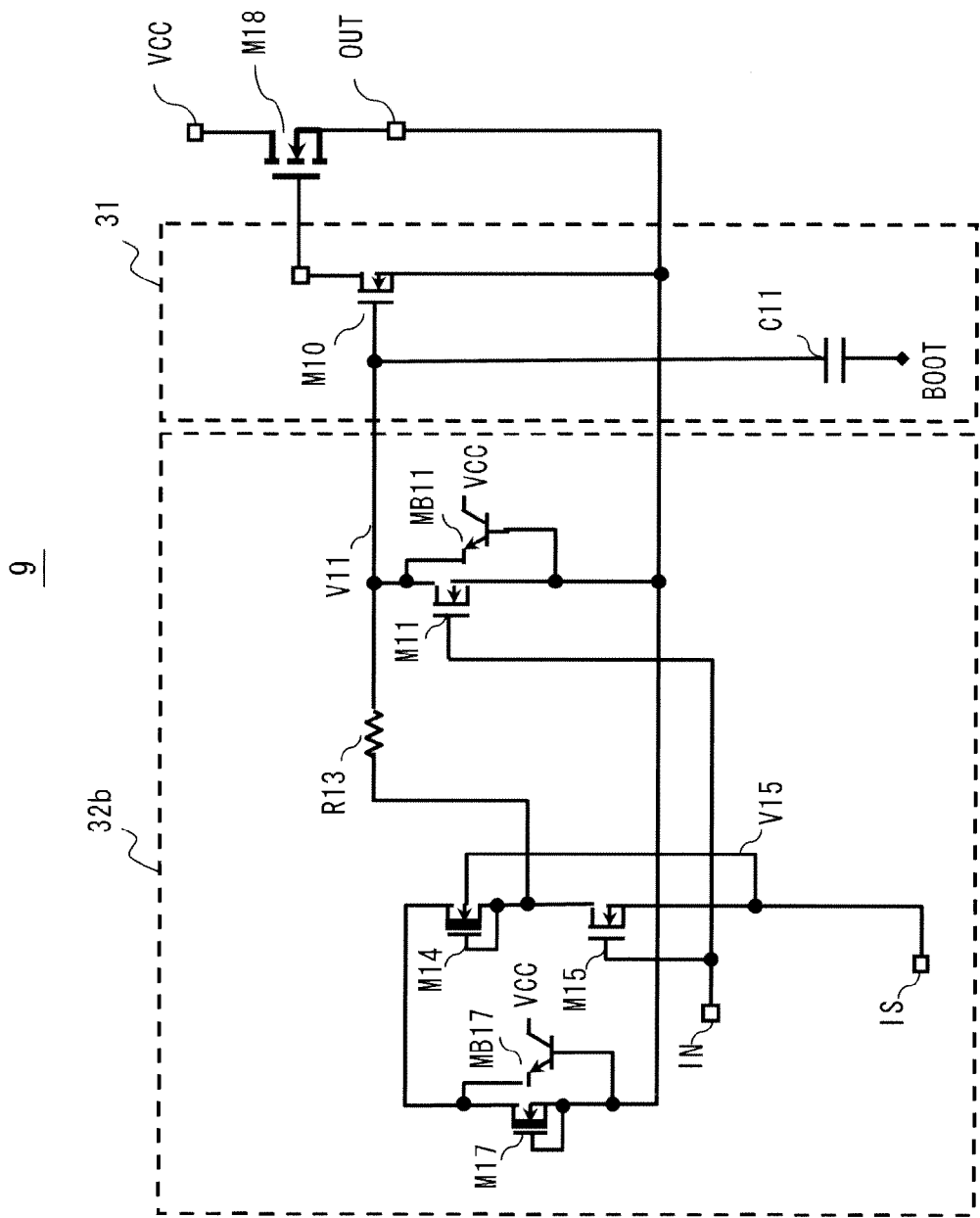
FIG. 4 is a circuit diagram showing the semiconductor device according to the first exemplary embodiment (considering parasitic elements)

The semiconductor device according to the first exemplary embodiment is described below. FIG. 3 is a circuit diagram of the semiconductor device 9 showing only elements formed on a silicon surface (parasitic transistors are not shown). FIG. 4 is a circuit diagram of the semiconductor device 9 in which parasitic transistors are also shown. The semiconductor device 9 according to the first exemplary embodiment includes a discharge circuit 31 and control circuits 32a and 32b. The discharge circuit 31 includes a transistor M10 (first transistor) connected between the gate of the output transistor M18 and the output terminal OUT, and a capacitor C11 connected between the gate of the transistor M10 and an external abnormality detection circuit. Based on the abnormality detection signal from the abnormality detection circuits, the discharge circuit 31 turns on the transistor M10 using the electric charge of the capacitor C11, thereby discharging the gate voltage of the output transistor M18 to the output terminal OUT.

The control circuits 32a and 32b each include a charge path, a first discharge path, and a second discharge path. The charge path charges the capacitor C11 when the system turns on. The first discharge path discharges the electric charge of the charged capacitor C11 when the system turns off. The second discharge path discharges the electric charge of the capacitor C11 for a time period longer than a time period for discharging the gate voltage of the output transistor M18 by the discharge circuit, upon detection of an abnormality in the system.

The control circuit 32a includes a depletion-type transistor M17 (second transistor), a depletion-type transistor M14 (third transistor), an enhancement-type transistor M11 (fifth transistor), an enhancement-type transistor M15 (fourth transistor), and a resistor R13 (first resistor).

The transistor M11 has a drain connected to the gate of the transistor M10 of the discharge circuit 31, a source connected to the output terminal OUT, and a gate connected to a control terminal IN for controlling the system to turn on/off.

The resistor R13 has one end connected to the drain of the transistor M11, and the other end connected to the source and gate of the transistor M14.

The gate and source of the transistor M14 are short-circuited and connected to the other end of the resistor R13. The drain of the transistor M14 is connected to the drain of the transistor M17, and the backgate of the transistor M14 is connected to the discharge terminal IS for discharging the electric charge of the capacitor C11 in the normal OFF state.

The transistor M15 has a drain connected to the source of the transistor M14, a gate connected to the control terminal IN, and a source connected to the discharge terminal IS for discharging the electric charge of the capacitor C11 in the normal OFF state and connected to the backgate of the transistor M14.

The first discharge path includes the resistor R13 and the transistor M15. The second discharge path includes the resistor R13 and the transistors M14 and M17.

Figure 5:
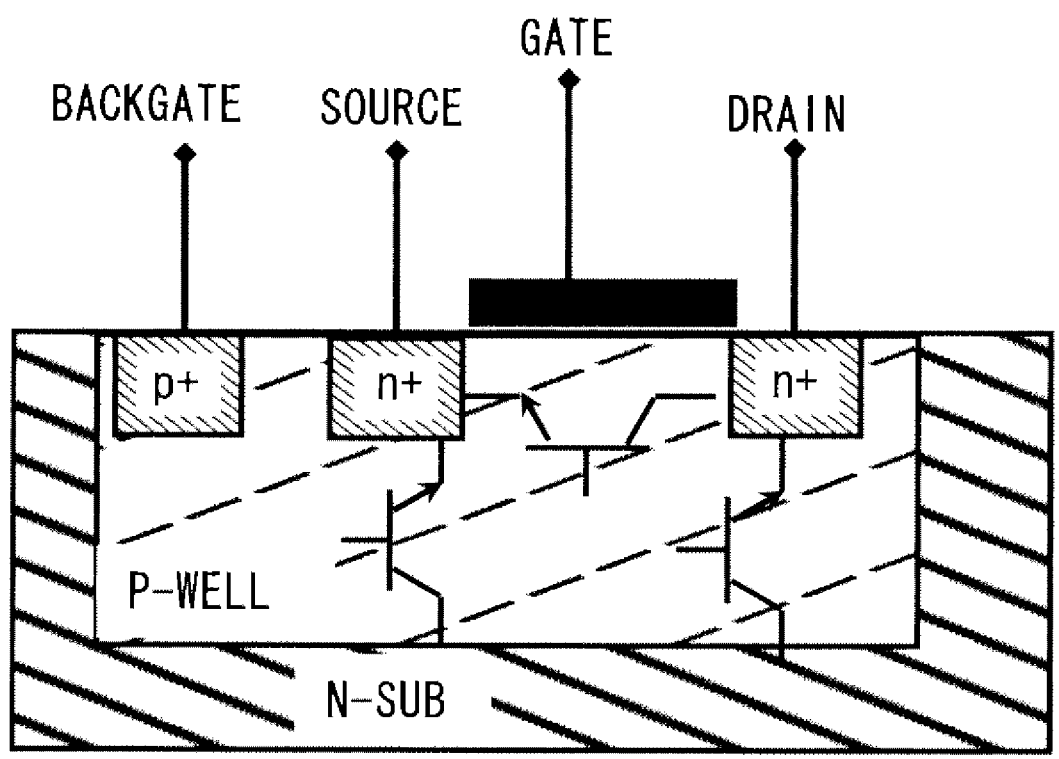
FIG. 5 is a sectional view showing an N-type transistor according to the first exemplary embodiment.

In this case, the semiconductor device according to the first exemplary embodiment includes N-type transistors formed in a P-well on an N-type substrate. Thus, each N-type transistor includes a vertical NPN parasitic bipolar transistor. FIG. 5 shows a sectional view of the N-type transistor.

A parasitic bipolar transistor MB17 has an N-type semiconductor substrate as a collector, the P-well region as a base, and the drain of the transistor M17 as an emitter.

A parasitic bipolar transistor MB11 has the N-type semiconductor substrate as a collector, a P-well region as a base, and the drain of the transistor M11 as an emitter.

Referring again to FIG. 4, the discharge circuit 31 performs the rapid discharge operation. The semiconductor device 9 utilizes the electric charge of the capacitor C11. When the abnormality detection circuits detect an abnormality, the potential of the abnormality detection signal BOOT changes from OUT−GNDX to VCC. As a result, the transistor M10 operates in a linear region having a low on-resistance, and rapidly discharges the electric charge of the gate of the output transistor M18 to the output terminal OUT.

Figure 6:
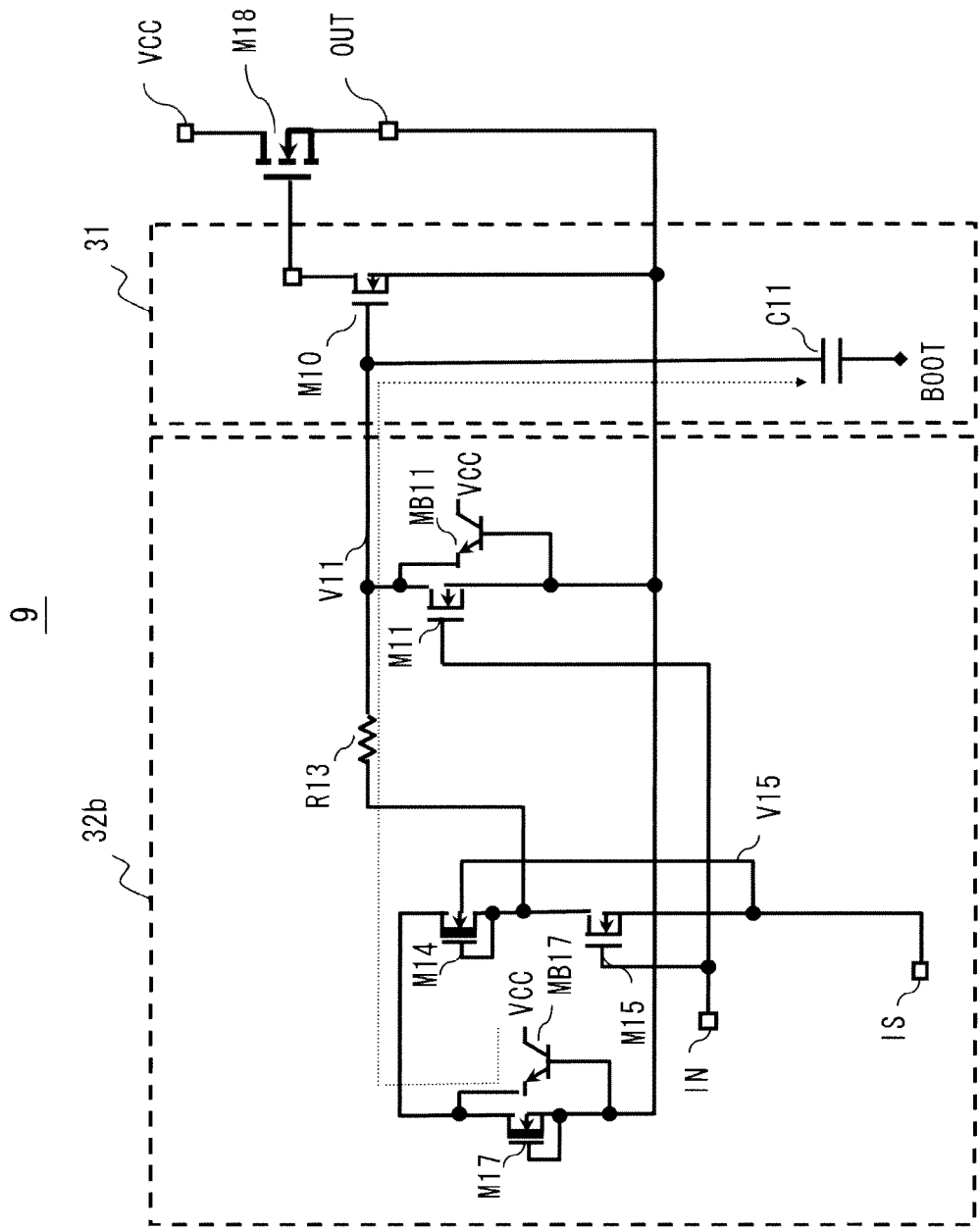
FIG. 6 is a diagram showing a charge path in a normal ON state according to the first exemplary embodiment.

Here, a normal ON operation is described below. In the normal ON state, the control circuit 31 charges the capacitor C11. FIG. 6 shows a charge path in the normal ON state.

In the normal ON state, an electric charge for bootstrap operation upon detection of an abnormality is supplied to the capacitor C11. The parasitic bipolar transistor MB17 supplies the electric charge to the capacitor C11 through the transistor M14 and the resistor R13. The base of the parasitic bipolar transistor MB17 is supplied with a current from the output terminal OUT, and the current flows from the collector to the emitter.

In this case, the input terminal IN is at "L" level (N="L" level), so the transistor M15 turns off and no current flows through the discharge terminal IS. The transistor M10 turns off because the transistor M11 turns off and a gate potential V11 of the transistor M10 is pulled down to the output terminal OUT through the resistor R13, the transistor M14, and the transistor M17.

An electric charge Q stored in the capacitor C11 is expressed as Q=C11×GNDX, because a voltage applied to both ends of the capacitor C11 is expressed as V11−BOOT=OUT−(VCC−GNDX)≈GNDX (assuming that OUT=VCC−Ron×IL≈VCC).

Figure 7:
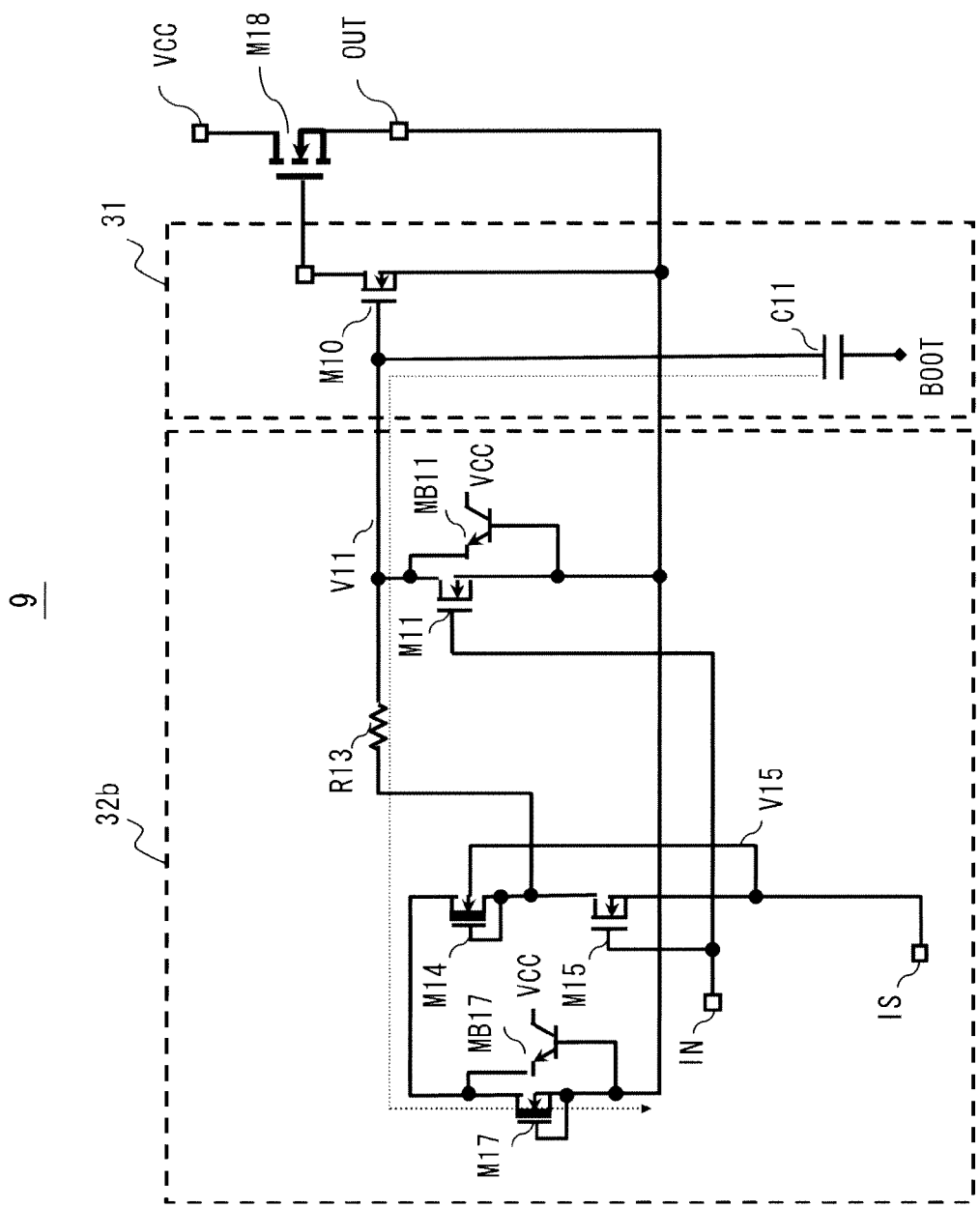
FIG. 7 is a diagram showing a discharge path for a rapid discharge operation according to the first exemplary embodiment.

Next, a rapid discharge operation of the control circuit 32b upon detection of an abnormality is described below. FIG. 7 is a diagram showing a discharge path for the rapid discharge operation. The second discharge path, which is a discharge path for the rapid discharge operation, includes the resistor R13 and the transistors M14 and M17. In the rapid discharge operation, the time period for discharging the electric charge of the capacitor C11 to the output terminal OUT is set to be longer than the time period for discharging the gate voltage of the output transistor M18 to the output terminal OUT. After completion of the rapid discharge operation of the output transistor M18, the electric charge of the capacitor C11 can be discharged.

The rapid discharge operation is described in more detail below. Upon detection of an abnormality, the abnormality detection signal BOOT becomes VCC (BOOT=VCC), and the gate potential V11 of the transistor M10 is boosted from OUT to OUT+GNDX, and the transistor M10 operates in the linear region. When the transistor M10 turns on, the gate voltage of the transistor M18 is output to the output terminal OUT, and the output transistor M18 is rapidly cut off. Since the input terminal IN is at "L" level (IN="L" level), the transistor M15 turns off and no electric charge is discharged to the discharge terminal IS.

The electric charge of the capacitor C11 is discharged to the discharge terminal OUT through the resistor R13, the transistor M14, and the transistor M17. The time period for discharging the electric charge of the capacitor C11 is adjusted to be longer than the time period between a rapid cut-off operation of the transistor M10 and a turn-off operation of the output transistor M18, by adjusting the value of the resistor R13 and the on-resistance value of each of the transistors M14 and M17.

A description is given of the necessity of discharging the electric charge of the capacitor C11 upon detection of an abnormality. In the first exemplary embodiment, the electric charge of the capacitor C11 is discharged after the gate potential of the transistor M10 is boosted using the electric charge of the capacitor C11, or after the rapid cut-off operation of the output transistor M18 is completed. If the electric charge of the capacitor C11 is not discharged, the electric charge remains in the gate of the transistor M10 upon returning to normal and turning on after detection of an abnormality. If the electric charge remains in the gate of the transistor M10, the transistor M10 turns on and the gate of the output transistor M18 and the output terminal OUT tend to be short-circuited with a low resistance. This inhibits the turn-on operation.

Figure 8:
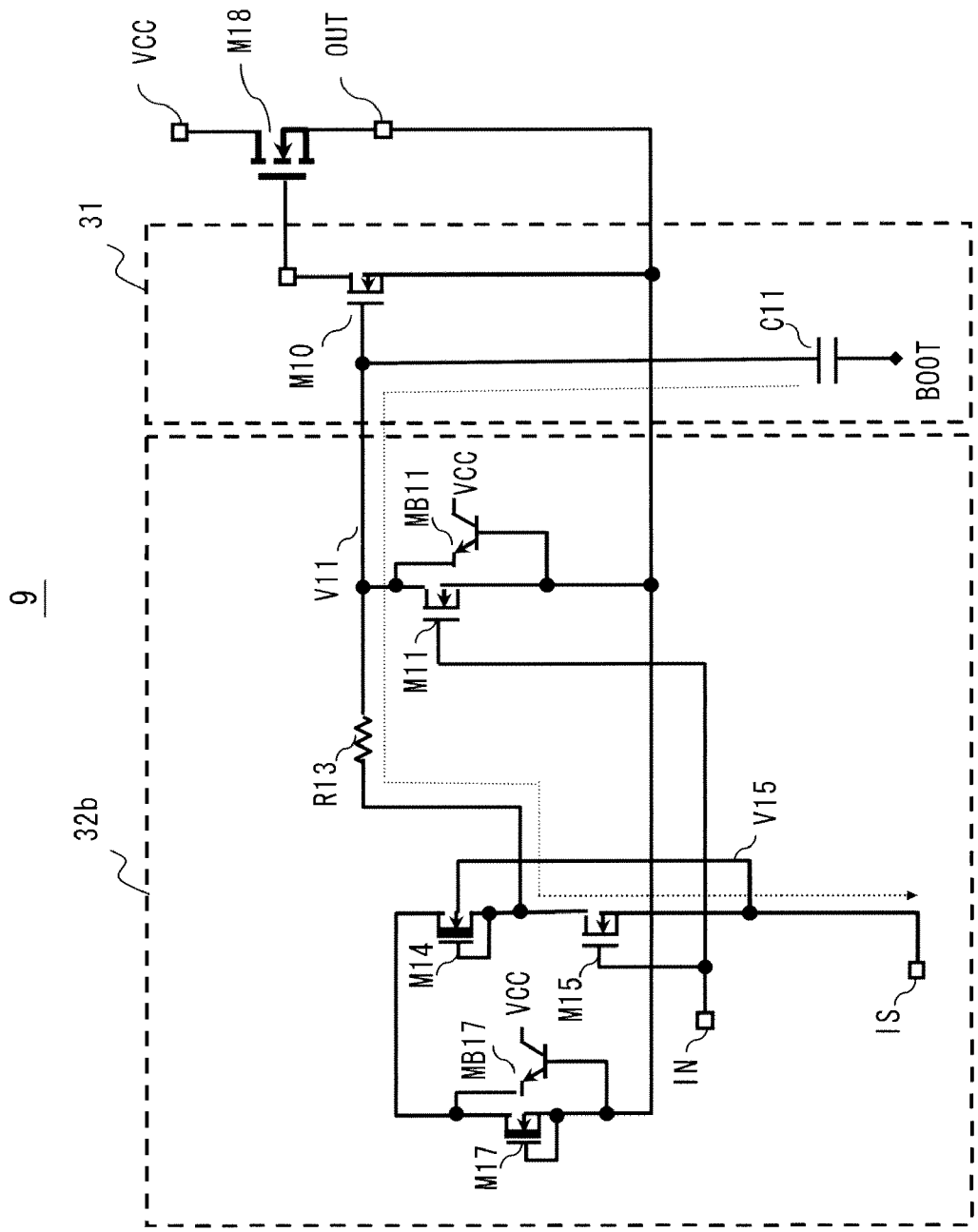
FIG. 8 is a diagram showing a discharge path in a normal OFF state according to the first exemplary embodiment.

Next, the operation of the semiconductor device in the normal OFF state is described. FIG. 8 is a diagram showing a discharge path in the normal OFF state. In the normal OFF state, the electric charge of the capacitor C11 is discharged to the discharge terminal IS through the resistor R13 and the capacitor M15.

The discharge operation in the normal OFF state is described in more detail below. The potential IN of the input terminal IN becomes "VCC" (IN="VCC"), so the transistor M15 turns on, and the electric charge of the capacitor C11 in the normal ON state is discharged to the discharge terminal IS through the resistor R13 and the transistor M15. This discharge operation prevents the rapid discharge operation from being performed without boosting the gate potential of the transistor M10 to BOOT+GNDX even when the control signal BOOT is at "H" level (BOOT="H" level). Note that no noise occurs even if the gate charge of the output transistor M18 is rapidly discharged only immediately after the turn-off operation (only during the time period in which OUT≈VCC is maintained). Accordingly, the resistor R13 and the current path thereof may be adjusted to allow the transistor M10 to operate only immediately after the operation in the normal OFF state is started, thereby shortening the turning-off time.

Further, the base of the parasitic bipolar transistor MB11 of the transistor M11 is supplied with a current from the output terminal OUT, and the current flows from the N-type semiconductor substrate VCC serving as the collector to the discharge terminal IS through the source of the transistor M11 serving as the emitter. However, the current value is limited by the resistor R13 to thereby prevent breakdown from occurring due to thermal runaway.

Here, the effect of flowing the current to the discharge terminal IS is described. In the normal ON state, a sense current flows through the discharge terminal IS. The sense current has a constant ratio with respect to a current flowing through the output transistor M18. In the OFF state, a current equivalent to that in the normal ON state or a GND level current is generally output. In the first exemplary embodiment, the operating current of the parasitic bipolar transistors flows through the discharge terminal IS in the OFF state. However, the current value is limited so as to prevent a current having a value greater than the constant ratio with respect to the current flowing through the output transistor M18 from flowing, and to prevent a microcomputer (not shown) which monitors the ratio of the current flowing through the output transistor M18 from being determined as abnormal.

In the first exemplary embodiment, the control circuit 32 (shown as 32a 32b) carries out the rapid discharge operation immediately after the abnormality detection signal BOOT is made active. At the same time, the electric charge for bootstrap operation is discharged to a low potential terminal (GND terminal or discharge terminal IS) in the normal state, thereby preventing the gate of the transistor for rapid discharge operation from being boosted. This makes it possible to prevent the turn-off operation of the output transistor M18 in the normal state from being interrupted. Moreover, the electric charge of the capacitor C11 is discharged for a time period longer than the time period for completing the rapid cut-off operation of the output transistor M18. Consequently, the subsequent turn-off operation of the output transistor M18 can be normally carried out while shortening the time required for the rapid cut-off operation of the output transistor M18.

[Second Exemplary Embodiment]

In the first exemplary embodiment, when the potential of the output terminal OUT is rapidly lowered by the rapid discharge operation of the transistor M18, the voltage of the output terminal OUT may become a negative voltage due to inductance components of a harness extending from the output terminal OUT to the load and a harness extending from the load to the minus terminal of the power supply (the lower limit of the voltage of the output terminal OUT changes depending on a breakdown voltage of the output transistor, a peak current upon detection of an abnormality, a slew rate at a falling edge of the voltage of the output terminal OUT, and inductance components of harnesses). In this case, when the rapid cut-off operation is carried out upon detection of an abnormality, there is a possibility that the transistor M10 turns off during the cut-off operation and the rapid cut-off operation is interrupted.

Further, the state in which the rapid discharge operation is interrupted is described in detail below. A gate-source voltage Vgs of the transistor M11 is equal to IN−OUT (Vgs=IN−OUT). When the potential VOUT of the output terminal OUT is a negative voltage, assuming that IN=0 V and VOUT=−10 V, for example, the gate-source voltage Vgs of the transistor M11 is expressed as Vgs=0−(−10)=10 V, and thus the transistor M11 turns on. When the transistor M11 turns on, the gate potential V11 of the transistor M10 is equal to VOUT (V11=VOUT), and thus the transistor M10 turns off. When the transistor M10 turns off, the operation of discharging the gate voltage of the transistor M18 is interrupted. Thus, the rapid discharge operation is interrupted.

Figure 9:
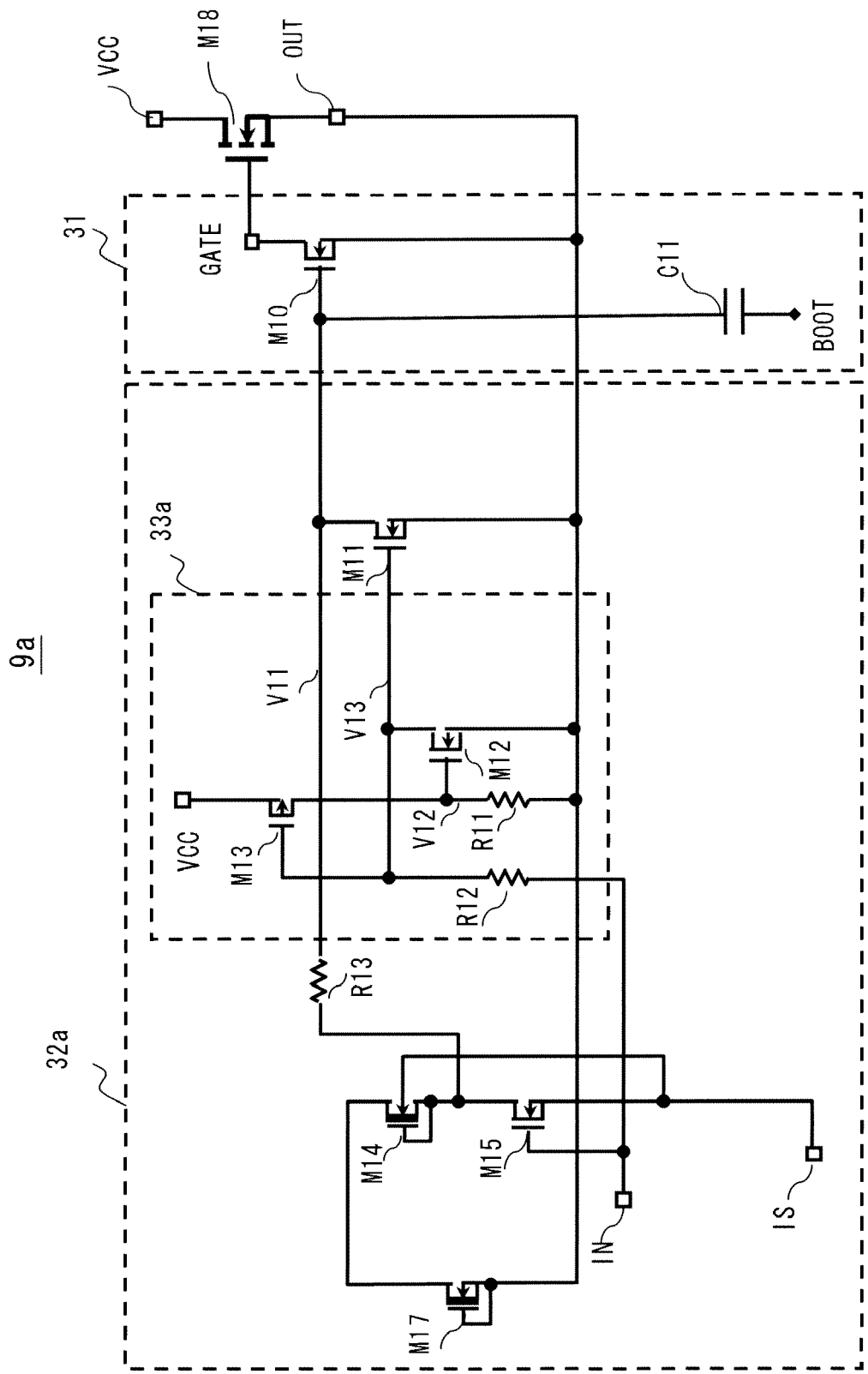
FIG. 9 is a circuit diagram showing a semiconductor device according to a second exemplary embodiment of the present invention.
Figure 10:
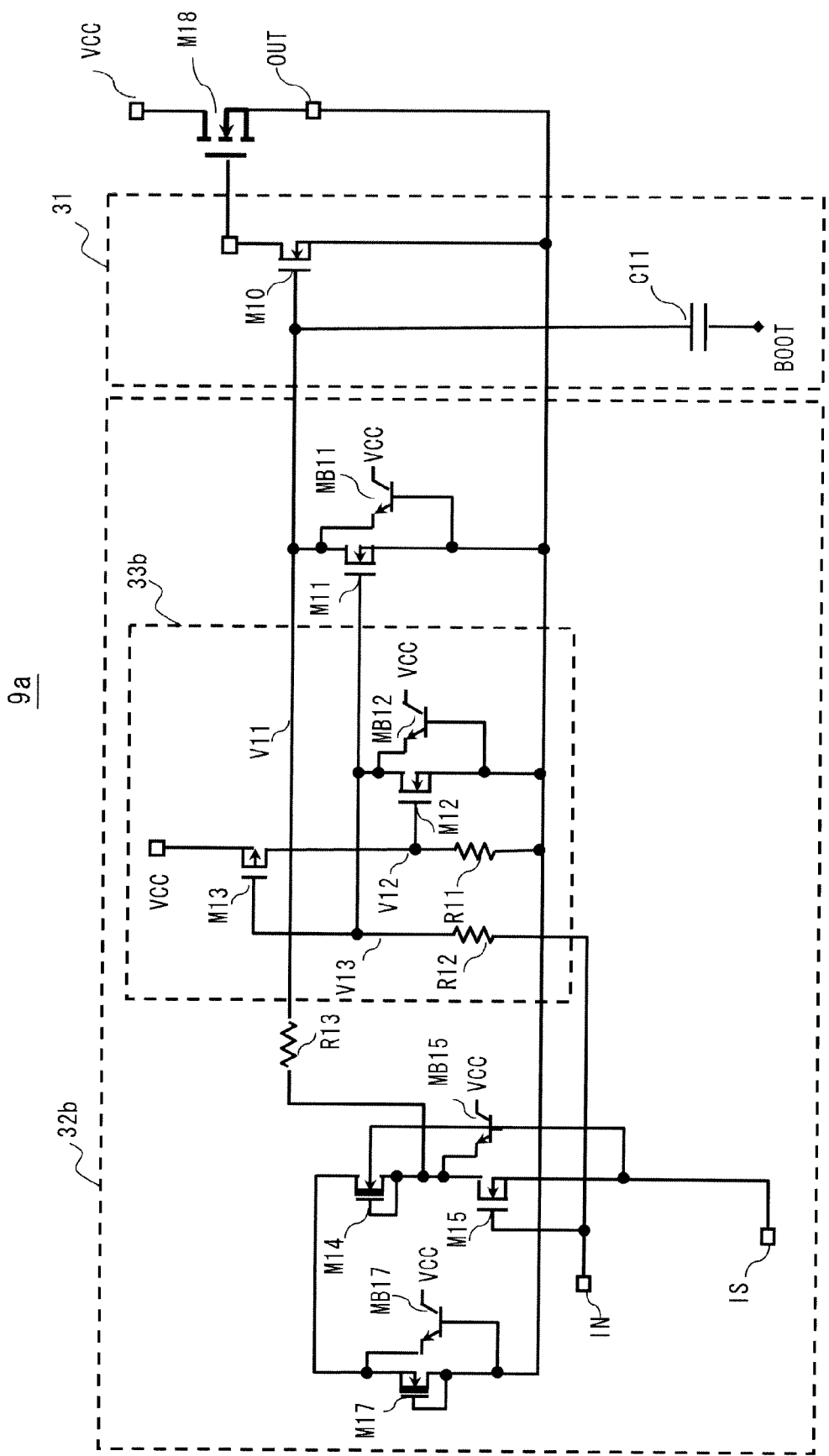
FIG. 10 is a circuit diagram showing the semiconductor device according to the second exemplary embodiment (considering parasitic elements)

A second exemplary embodiment of the present invention solves the problem that when the rapid discharge operation is carried out in the first exemplary embodiment, a negative voltage occurs at the output terminal OUT, which may result in interruption of the rapid discharge operation. FIGS. 9 and 10 are circuit diagrams of the semiconductor device 9a according to the second exemplary embodiment. FIG. 9 shows the semiconductor device 9a in which only elements formed on the surface are considered, while FIG. 10 shows the semiconductor device 9a in which the elements formed on the surface as well as the parasitic elements are considered. Portions respectively denoted by reference symbols 33a and 33b in FIGS. 9 and 10 correspond to a prevention circuit 33 which is added in the second exemplary embodiment.

The prevention circuit 33b includes a transistor M13 serving as a sixth transistor, a transistor M12 serving as a seventh transistor, a parasitic bipolar transistor MB12 serving as a second parasitic bipolar transistor, a resistor R11 serving as a second resistor, and a resistor R12 serving as a third resistor.

The transistor M13 is a P-type enhancement transistor having a drain connected to the power supply terminal VCC, and a source connected to the output terminal OUT through the resistor R11.

The transistor M12 is an enhancement-type transistor having a drain connected to the gate of the transistor M11, a source connected to the output terminal OUT, and a gate connected to the drain of the transistor M13.

The parasitic bipolar transistor MB12 has an N-type semiconductor substrate as a collector, the drain of the transistor M12 as an emitter, and a P-well region as a base.

The resistor R12 has one end connected to the gate of the transistor M13, and the other end connected to the control terminal IN.

A parasitic bipolar transistor MB15, which does not operate in the first exemplary embodiment, has not been described in the first exemplary embodiment. However, the parasitic bipolar transistor MB15 is described herein because the parasitic bipolar transistor MB15 operates when the output terminal OUT is lower than the "L" level upon detection of an abnormality.

The operation in the normal ON state is described below. The transistor M11 is affected by the operation of the prevention circuit 33 (shown as 33a, 33b). A gate potential V13 of the transistor M11 is described. The gate potential V13 of the transistor M11 is determined by the operations of the transistor M12 and the parasitic bipolar transistor MB12 of the transistor M12. Assume that Vf represents a threshold voltage of the parasitic transistor MB12, and V13 represents a gate voltage of the transistor M11. When one of the transistor M12 and the parasitic bipolar transistor MB12 turns on, VOUT−Vf≦V13≦VOUT is satisfied. When both the transistor M12 and the parasitic bipolar transistor MB12 turn off, the gate potential V13 is pulled down to VIN="L" level (V13=VIN="L" level). In the normal ON state, the transistor M11 turns off in either case. Accordingly, the control circuit 32 operates in the same manner as in the first exemplary embodiment.

Next, the operation in the normal OFF state is described. Since the potential VIN of the input terminal IN is greater than the potential VOUT of the output terminal OUT (VIN>VOUT), the parasitic bipolar transistor MB12 does not operate. The gate potential V13 of the transistor M11 is equal to VCC (V13=VCC), and a gate potential V12 of the transistor M12 is stable at VOUT (V12=VOUT). Accordingly, the same operation as that of the first exemplary embodiment is carried out, as with the normal ON state.

Next, the rapid cut-off operation upon detection of an abnormality is described. In the first exemplary embodiment, there is a problem that when a negative voltage is generated at the output terminal OUT and the "L" level of the input terminal IN is higher than VOUT ("L" level of input terminal IN>VOUT), the transistor M11 turns on. In the second exemplary embodiment, when the cut-off operation is starting, during the time period when the transistor M12 does not turn on yet, the parasitic bipolar transistor MB12 turns on. Accordingly, the potential V13 of the transistor M11 is equal to VOUT−Vf (V13=VOUT−Vf), and thus the transistor M11 turns off. Furthermore, when the potential of the output terminal OUT decreases and when VOUT<V12−Vt (assume that Vt represents a threshold voltage of the transistor M12), the transistor M12 reliably turns on. Even when the potential of the output terminal OUT decrease below the "L" level of the input terminal IN, the gate potential V12 of the transistor M12 is kept equal to VCC (V12=VCC). Therefore, the transistor M12 is kept in ON state and the gate potential V13 of the transistor M11 is short-circuited to the output terminal OUT. As a result, even when the "L" level of the input terminal IN is higher than the potential VOUT at the output terminal OUT ("L" level of IN>VOUT), the gate potential V13 of the transistor M11 is equal to the potential VOUT of the output terminal OUT (V13=VOUT), so the transistor M11 does not turn on. Therefore, unlike the first exemplary embodiment, the transistor M11 does not turn on during the rapid discharge operation, and the ON state of the transistor M10 is maintained, thereby preventing the rapid discharge operation from being interrupted.

In the second exemplary embodiment, the rapid discharge operation can be prevented from being interrupted even if a negative voltage occurs at the output terminal OUT when the output transistor M18 carries out the rapid discharge operation upon detection of an abnormality.

[Third Exemplary Embodiment]

In a system to which the present invention is applied, a load having a large inductance component may be driven and a negative voltage may be generated at the output terminal OUT also in the normal OFF state. Under this effect, there is a problem in the second exemplary embodiment that a negative voltage occurs at the discharge terminal IS. The discharge terminal IS is usually monitored by a microcomputer (not shown), which raises a fear that the microcomputer may be destroyed when the voltage of the discharge terminal IS becomes a negative voltage.

Here, a description is given of the case where a negative voltage occurs at the discharge terminal IS. When the voltage of the output terminal OUT becomes a negative voltage, the potential of the output terminal OUT is lower than the ground level of the system incorporating the semiconductor device 9b. Accordingly, a current is supplied from the discharge terminal IS to the base of the parasitic bipolar transistor MB15 of the transistor M15, and the current is discharged to the output terminal OUT through the resistor R13 and the transistor M11. In this case, a potential VIS of the discharge terminal IS is expressed as GND>VIS>VOUT. Thus, the potential of the discharge terminal IS also becomes a negative voltage. As described in the second exemplary embodiment, since the transistor M11 turns off in an abnormality detection OFF state, such a problem does not occur. In a third exemplary embodiment of the present invention, the transistor M11 turns on, because the potential VIN is at "H" level (VIN="H" level) in the normal OFF state of an inductance load.

Figure 11:
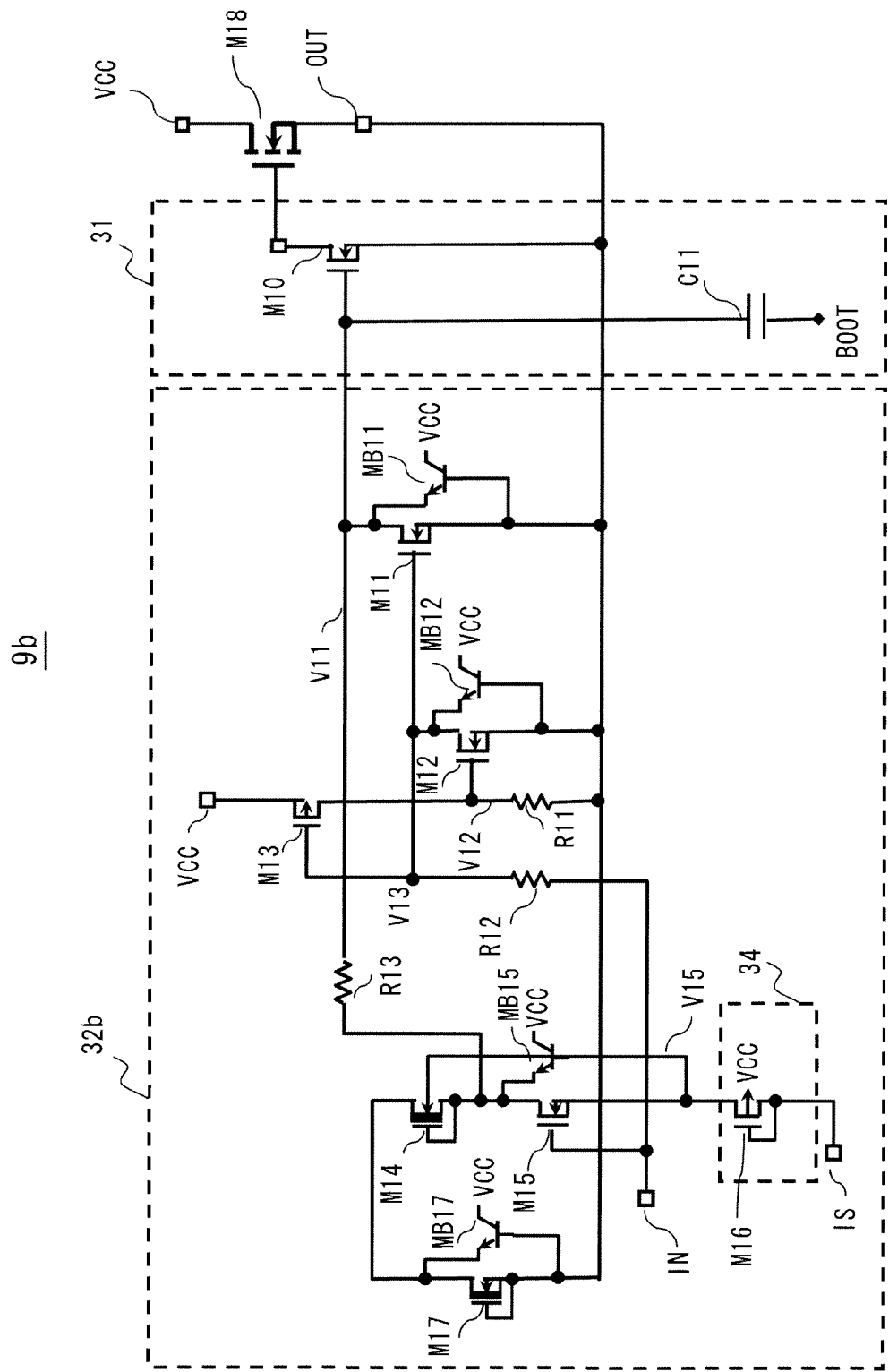
FIG. 11 is a circuit diagram showing a semiconductor device according to a third exemplary embodiment of the present invention (considering parasitic elements)
Figure 12A:
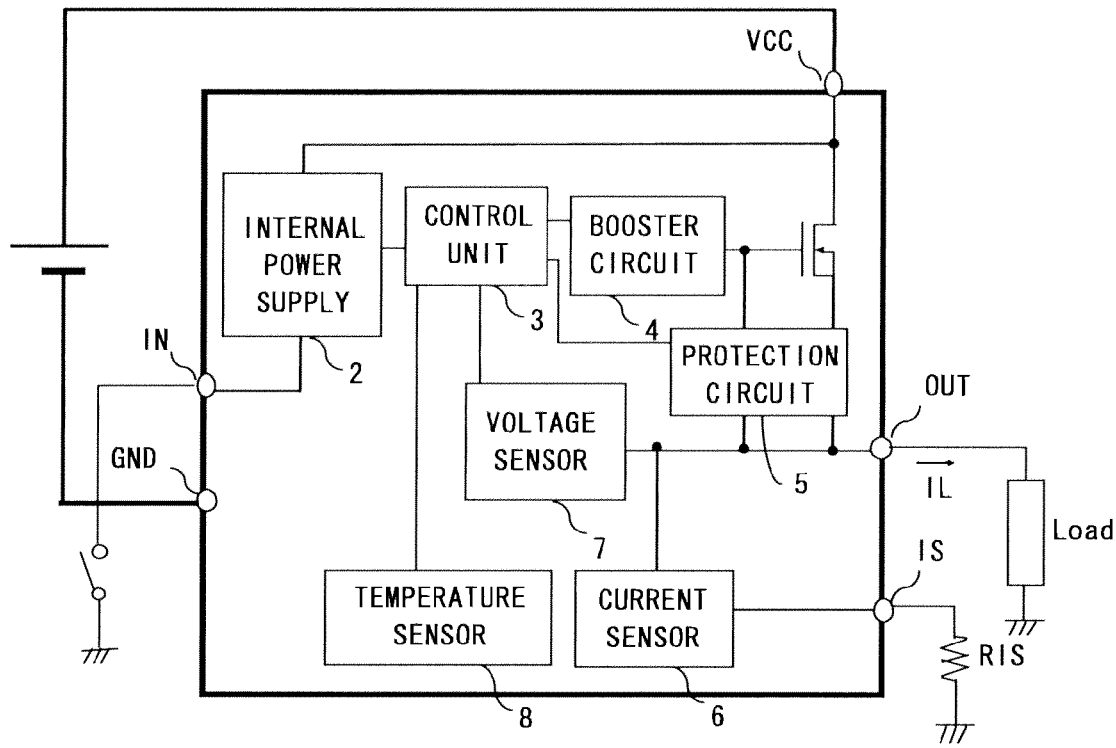
FIGS. 12A and 12B are diagrams each showing a high-side output IC of the prior art.
Figure 12B:
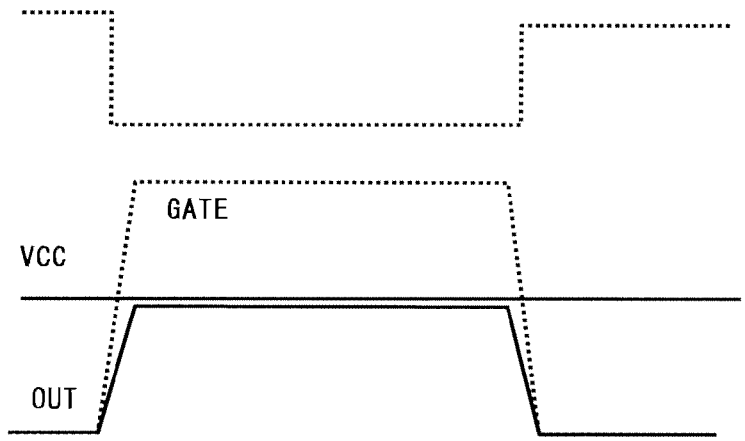
Figure 13:
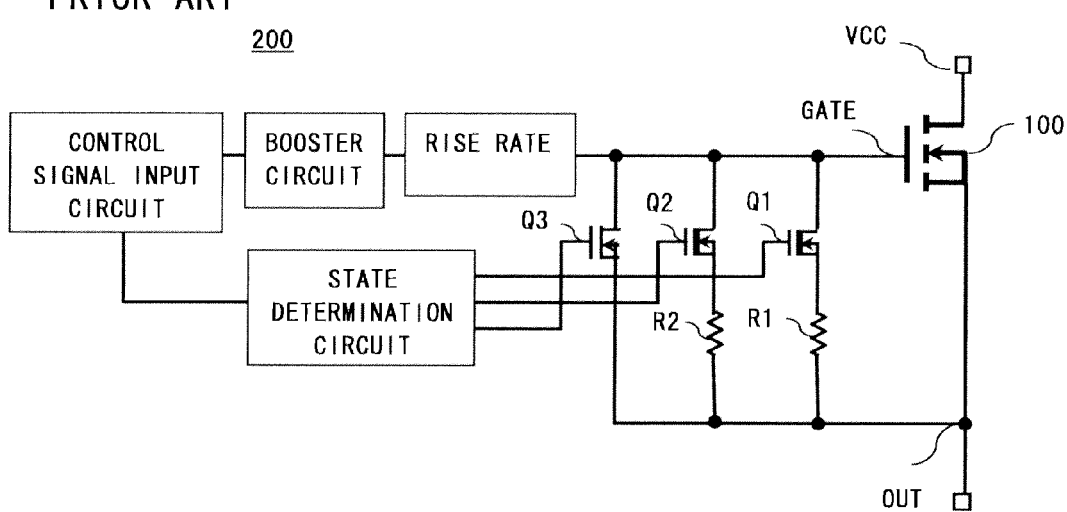
FIG. 13 is a diagram showing an output circuit of the prior art.
Figure 14A:
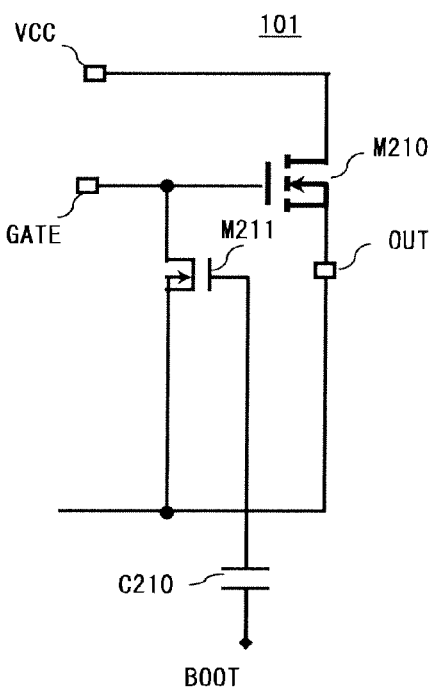
FIGS. 14A and 14B are diagrams each showing an exemplary bootstrap circuit.
Figure 14B:
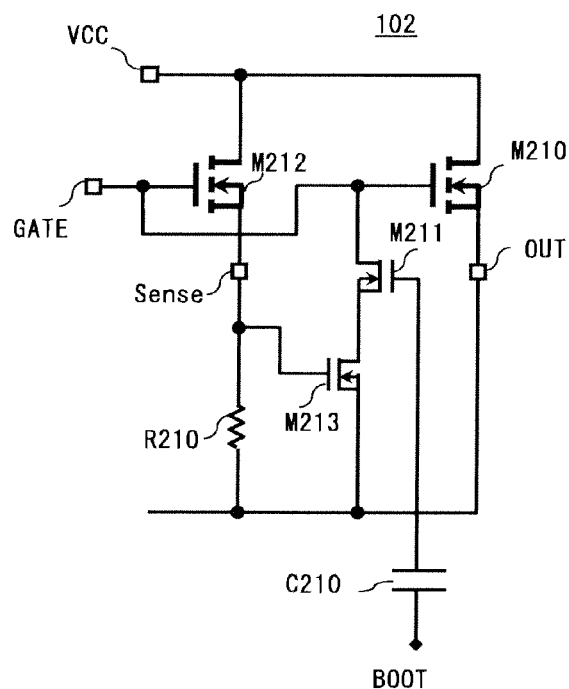

The third exemplary embodiment prevents a negative voltage from occurring at the discharge terminal IS in the normal OFF state when the load having a large inductance component is driven. FIG. 11 is a circuit diagram showing the semiconductor device 9b according to the third exemplary embodiment. The semiconductor device according to the third exemplary embodiment further includes a transistor M16 serving as an eighth transistor connected between the source of the transistor M15 and the discharge terminal IS, as an IS protection circuit 34, in addition to the circuits of the second exemplary embodiment.

FIG. 11 shows the semiconductor device 9 in which parasitic elements are also shown. In the third exemplary embodiment, the transistor M16 is added between the transistor M15 and the discharge terminal IS so as to prevent a negative voltage from occurring at the discharge terminal IS. Note that the operations in the normal OFF state, normal ON state, abnormality detection state, and abnormality OFF state are similar to those of the second exemplary embodiment.

The normal OFF state of the inductance load is described. In order to prevent a negative voltage from occurring at the discharge terminal IS, it is necessary to prevent the reverse current (base current of the parasitic bipolar transistor MB15), which flows from the discharge terminal IS to the output terminal OUT, from flowing. For this reason, the P-type enhancement-type transistor M16, the gate and drain of which are short-circuited, is connected in series between the discharge terminal IS and the base of the bipolar transistor MB15. When the voltage of the output terminal OUT becomes a negative voltage, the voltage of the discharge terminal IS is higher than the voltage of the output terminal OUT. Accordingly, the transistor M16 is cut off, and a path for the base current supplied to the bipolar transistor MB15 is cut off, thereby preventing the voltage of the discharge terminal IS from becoming a negative voltage. The problem that a negative voltage occurs at the output terminal OUT in the normal OFF time in the case of driving the load having a large inductance component can be solved by adding the transistor M16.

In this case, the addition of the transistor M16 may result in loss of the protective function at the time of battery reverse connection. The reverse connection of the battery is described below. Normally, when the battery is reversely connected in the system using the output transistor as the high-side output circuit 1, a current flows to the power supply terminal VCC from the output terminal OUT through a body diode of the output transistor. Then, a voltage drop corresponding to the amount of the load voltage Vf occurs in the body diode, resulting in an increase in heat generation in the output transistor. In this regard, a method is known in which, when a battery is reversely connected, heat generation is suppressed by boosting the gate voltage of the output transistor M18 to allow a current to flow through a channel. This function is called a protective function at the time of battery reverse connection.

Next, consider the input terminal IN and the discharge terminal IS when the battery is reversely connected. The transistor M16 added in the first exemplary embodiment allows the input terminal IN to be connected to an external ground GND through a switch such as a transistor and allows the discharge terminal IS to be connected to the external ground GND through a resistor. Thus, when the battery is reversely connected, both the input terminal IN and the discharge terminal IS reach a substantially maximum potential. Since the discharge terminal IS is at high potential, the transistor M16, which is a P-type transistor, is cut off. Here, a potential V15 of the backgate of the transistor M14 is described.

When the transistor M16 is cut off and becomes unstable, the value of the potential V15 may increase due to the influence of elements arranged in the vicinity thereof. When the value of the potential V15 increases, the value of the gate potential V11 of the transistor M11 may also increase through a PN junction between the base and emitter of the parasitic bipolar transistor MB15, and the transistor M10 may turn on. When the transistor M10 turns on, the gate potential of the output transistor M18 decreases. Thus, no current flows through the output transistor M18, and the function for suppressing heat generation is impaired. As a result, the protective function at the time of battery reverse connection may be impaired.

In the third exemplary embodiment, the resistance value of the resistor R13 is set to be much higher than the on-resistance value of the transistor M11. This prevents the potential V15 of the backgate of the transistor M14 from being indefinite when the battery is reversely connected, thereby making it possible to maintain the protective function. Here, another path for determining the potential V15 of the backgate of the transistor M14 includes the resistor R13 and the transistor M11. Since the input terminal IN is at high potential, the gate potential V13 of the transistor M11 is also high, and the transistor M11 operates in a low resistance state. If the resistance value of the resistor R13 is much higher than the on-resistance value of the transistor M11, the gate potential V11 of the transistor M10 is substantially equal to the potential of the output terminal OUT, and thus the transistor M10 does not turn on.

The on-resistance value of the transistor M11 is set to be much lower than the resistance value of the resistor R13, thereby preventing the transistor M10 from turning on even when the battery is reversely connected. Therefore, the function for boosting the gate voltage of the output transistor M18 can be maintained.

The use of the semiconductor device according to the third exemplary embodiment makes it possible to perform the rapid discharge operation immediately after detection of an abnormality by using an existing terminal as the GND terminal even in the high-side output transistor having no GND terminal. This leads to a reduction in the loss occurring in the turn-off operation upon detection of an abnormality.

The semiconductor device according to the third exemplary embodiment is capable of distinguishing a normal turning on/off operation from the rapid discharge operation upon detection of an abnormality. Moreover, addition of the prevention circuit 33 or 34 prevents the rapid discharge operation from being interrupted even when a negative voltage is generated at the output terminal and the discharge terminal.

The present invention is not limited to the above exemplary embodiments, but can be modified in various ways without departing from the scope of the present invention.

The first, second, and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor device comprising:
an output transistor that is connected between a power supply terminal and an output terminal and outputs a current to a load connected to the output terminal;
a discharge circuit that includes: a first transistor connected between a gate of the output transistor and the output terminal; and a capacitor connected between a gate of the first transistor and an external abnormality detection circuit, and discharges a gate voltage of the output transistor to the output terminal by turning on the first transistor with an electric charge of the capacitor, based on an abnormality detection signal from the abnormality detection circuit; and
a control circuit that includes: a charge path for charging the capacitor when a system turns on; a first discharge path for discharging an electric charge of the charged capacitor when the system turns off; and a second discharge path for discharging the electric charge of the capacitor for a time period longer than a time period for discharging the gate voltage of the output transistor by the discharge circuit, upon detection of an abnormality in the system.

2. The semiconductor device according to claim 1, wherein the second discharge path includes a depletion-type second transistor having a gate and a source which are short-circuited, and discharges the electric charge of the charged capacitor to the output terminal through the second transistor.

3. The semiconductor device according to claim 1, wherein the second discharge path includes:
a depletion-type second transistor having a gate and a source which are short-circuited;
a first resistor; and
a depletion-type third transistor having a source connected to the first resistor, and a backgate connected to a discharge terminal for discharging the electric charge of the capacitor in a normal OFF state, a source and a gate of the third transistor being short-circuited, and
the second discharge path discharges the electric charge of the charged capacitor to the output terminal through the second transistor.

4. The semiconductor device according to claim 1, wherein the second discharge path discharges the electric charge of the capacitor to the output terminal.

5. The semiconductor device according to claim 1, wherein the second discharge path includes a depletion-type second transistor having a gate and a source which are short-circuited, and
the charge path includes a first parasitic bipolar transistor serving as a parasitic bipolar transistor of the second transistor.

6. The semiconductor device according to claim 1, wherein the second discharge path includes a depletion-type second transistor having a gate and a source which are short-circuited,
the charge path includes a first parasitic bipolar transistor, and
the first parasitic bipolar transistor has an N-type semiconductor substrate as a collector, and a drain of the second transistor as an emitter.

7. The semiconductor device according to claim 1, wherein the second discharge path includes a depletion-type second transistor having a gate and a source which are short-circuited,
the charge path includes a first parasitic bipolar transistor serving as a parasitic bipolar transistor of the second transistor, a first resistor, and a depletion-type third transistor,
the depletion-type third transistor having a source connected to the first resistor, and a backgate connected to a discharge terminal, a gate and a source of the third transistor being short-circuited, and
the discharge terminal discharges the electric charge of the capacitor in a normal OFF state.

8. The semiconductor device according to claim 1, wherein the first discharge path includes a fourth transistor having a gate connected to a control terminal, and a source connected to a discharge terminal, and
the electric charge of the capacitor is discharged by turning on the fourth transistor, and
the discharge terminal discharges the electric charge of the capacitor in a normal OFF state.

9. The semiconductor device according to claim 1, wherein the first discharge path includes:
a fourth transistor having a gate connected to a control terminal for controlling a turning on/off operation of the system, and a source connected to a discharge terminal; and
a first resistor connected between the capacitor and the fourth transistor, and
the discharge terminal discharges the electric charge of the capacitor in a normal OFF state.

10. The semiconductor device according to claim 1, wherein
the control circuit includes:
an enhancement-type fifth transistor having a drain connected to the discharge circuit, a source connected to the output terminal, and a gate connected to a control terminal for controlling a turning on/off operation of the system;
a first resistor having one end connected to the drain of the fifth transistor;
a depletion-type third transistor having a gate and a source which are short-circuited and connected to the other end of the first resistor;
an enhancement-type fourth transistor having a drain connected to the source of the third transistor, a gate connected to the control terminal, and a source connected to a discharge terminal for discharging the electric charge of the capacitor in a normal OFF state and connected to the backgate of the third transistor; and
a depletion-type second transistor having a drain connected to a drain of the third transistor, a gate and a source of the second transistor being short-circuited and connected to the output terminal.

11. The semiconductor device according to claim 1, wherein
the control circuit includes:
an enhancement-type fifth transistor having a drain connected to the discharge circuit, a source connected to the output terminal, and a gate connected to a control terminal for controlling a turning on/off operation of the system;
a first resistor having one end connected to the drain of the fifth transistor;
a depletion-type third transistor having a gate and a source which are short-circuited and connected to the other end of the first resistor;
an enhancement-type fourth transistor having a drain connected to the source of the third transistor, a gate connected to the control terminal, and a source connected to a discharge terminal for discharging the electric charge of the capacitor in a normal OFF state and connected to the backgate of the third transistor;

a depletion-type second transistor having a drain connected to a drain of the third transistor, a gate and a source of the second transistor being short-circuited and connected to the output terminal; and a prevention circuit that prevents discharge of the output transistor from being interrupted by turning on the fifth transistor, and the prevention circuit includes:

an enhancement-type sixth transistor having a source connected to the power supply terminal, and a gate connected to the gate of the fifth transistor;

a third resistor having one end connected to the gate of the sixth transistor, and the other end connected to the discharge terminal;

an enhancement-type seventh transistor having a drain connected to the gate of the fifth transistor, and a source connected to the output terminal; and a second resistor having one end connected to a drain of the sixth transistor and a gate of the seventh transistor, and the other end connected to the output terminal.

12. The semiconductor device according to claim 11, further comprising an eighth transistor connected between the source of the fourth transistor and a discharge terminal.

13. The semiconductor device according to claim 12, wherein the first resistor has a value greater than an on-resistance value of the fourth transistor.

14. The semiconductor device according to claim 1, wherein a control terminal controls a turning on/off operation of the system, a discharge terminal discharges the electric charge of the capacitor in a normal OFF state, the second discharge path includes a depletion-type second transistor having a gate and a source which are short-circuited, the charge path includes a depletion-type third transistor having a source connected to the first resistor, and a backgate connected to the discharge terminal, a gate and a source of the third transistor being short-circuited, the control circuit includes:

an enhancement-type fourth transistor having a drain connected to the source of the third transistor, a gate connected to the control terminal, and a source connected to the discharge terminal and connected to the backgate of the third transistor;

an enhancement-type fifth transistor having a drain connected to the discharge circuit, a source connected to the output terminal, and a gate connected to the control terminal; and an eighth transistor connected between the source of the fourth transistor and the discharge terminal, the prevention circuit includes:

an enhancement-type sixth transistor having a source connected to the power supply terminal, and a gate connected to the gate of the fifth transistor; and an enhancement-type seventh transistor having a drain connected to the gate of the fifth transistor, and a source connected to the output terminal, the first to fifth transistors and the seventh transistor are N-type transistors, and the sixth and eighth transistors are P-type transistors.

15. The semiconductor device according to claim 1, wherein the output transistor is an N-channel transistor.

16. The semiconductor device according to claim 1, wherein the abnormality detection circuit comprises at least one of: a current sensor that detects an abnormality in a load current flowing through the load; a temperature sensor that detects a temperature of the output transistor; and an output voltage sensor that detects a voltage of the output terminal.

17. A control method of a semiconductor device that turns off an output transistor upon detection of an abnormality in a system, the output transistor being connected between a power supply terminal and an output terminal and outputting a current to a load connected to the output terminal, the control method comprising:

charging a capacitor when the system turns on, the capacitor having one end connected to an external abnormality detection circuit, and the other end connected between a gate of the output transistor and the output terminal;

discharging a gate voltage of the output transistor to the output terminal by turning on the first transistor with an electric charge of the capacitor, based on an abnormality detection signal from the abnormality detection circuit; and discharging the electric charge of the capacitor to the output terminal for a time period longer than a time period for discharging the gate voltage of the output transistor.

* * * * *